(12) United States Patent
Kim

(10) Patent No.: US 8,921,822 B2
(45) Date of Patent: Dec. 30, 2014

(54) PHASE-CHANGE RANDOM ACCESS MEMORY DEVICE AND METHOD OF MANUFACTURING THE SAME

(71) Applicant: SK hynix Inc., Gyeonggi-do (KR)

(72) Inventor: Doo Kang Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,871

(22) Filed: Mar. 18, 2013

(65) Prior Publication Data

US 2014/0175368 A1   Jun. 26, 2014

(30) Foreign Application Priority Data

Dec. 26, 2012   (KR) .......................... 10-2012-0153453

(51) Int. Cl.
*H01L 29/02* (2006.01)
*H01L 21/00* (2006.01)
*H01L 45/00* (2006.01)
*H01L 27/24* (2006.01)

(52) U.S. Cl.
CPC ............ *H01L 45/1253* (2013.01); *H01L 45/06* (2013.01); *H01L 45/1246* (2013.01); *H01L 45/1683* (2013.01); *H01L 27/2409* (2013.01)
USPC ................................................ 257/4; 438/95

(58) Field of Classification Search
CPC .................. H10L 27/11556; H10L 45/1253; H10L 45/16; H10L 45/06; H10L 45/1683; H10L 45/1246
USPC ................................................. 257/4; 438/95
See application file for complete search history.

(56) References Cited

U.S. PATENT DOCUMENTS

| 7,985,654 | B2 * | 7/2011 | Breitwisch et al. | 438/422 |
| 8,039,297 | B2 * | 10/2011 | Kim et al. | 438/102 |
| 2007/0128870 | A1 * | 6/2007 | Chen | 438/689 |
| 2012/0225504 | A1 * | 9/2012 | Hong et al. | 438/17 |

FOREIGN PATENT DOCUMENTS

| KR | 1020060128379 | 12/2006 |
| KR | 1020100137627 | 12/2010 |

* cited by examiner

*Primary Examiner* — William D Coleman
(74) *Attorney, Agent, or Firm* — IP & T Group LLP

(57) ABSTRACT

A phase-change random access memory (PRAM) device and a method of manufacturing the same are provided. The PRAM device includes a semiconductor substrate in which a switching device is formed, a lower electrode configured to be formed on the switching device and having a void formed in a portion of an upper surface thereof, and a phase-change layer configured to be formed on the lower electrode having the void.

14 Claims, 7 Drawing Sheets

PHASE-CHANGE RANDOM ACCESS MEMORY DEVICE AND METHOD OF MANUFACTURING THE SAME

CROSS-REFERENCES TO RELATED APPLICATION

This application claims priority under 35 U.S.C. 119(a) to Korean application number 10-2012-0153453, filed on Dec. 26, 2012, in the Korean Patent Office, which is incorporated by reference in its entirety.

BACKGROUND OF THE INVENTION

1. Technical Field

The inventive concept relates to a nonvolatile memory device, and more particularly, to a phase-change random access memory (PRAM) device and a method of manufacturing the same.

2. Related Art

In recent years, as semiconductor memory devices, next-generation devices that are nonvolatile and are not necessary refresh have been researched with demands on high performance and low power. The next-generation memory devices may include PRAMs.

The PRAMs have properties that a resistance value thereof may be changed according to current or voltage and maintained as it is when the current or voltage is interrupted.

The PRAMs perform a memory operation by receiving current from a lower electrode and heating a phase-change material to change a resistance value. For example, when a reset pulse is applied to the phase-change material, the phase-change material is melted to be in a high resistance state, for example, logic value "1", and when a set pulse is applied to the phase-change material, the phase-change material is in a low resistance state, for example, logic value "0".

However, a heating temperature of the phase-change material constituting the PRAMs is proportional to an amount of current and thus it may be difficult to obtain high degree of integration. In particular, since current required for switching to the reset state larger than that required for switching to the set state, it may be desirable to reduce the current for the switching to the reset state in order to obtain high degree of integration.

SUMMARY

One or more exemplary embodiments of the present invention are provided to a PRAM device that may improve a lower electrode to reduce a reset current, and a method of manufacturing the same.

According to one aspect of an exemplary embodiment, there is provided a phase-change random access memory (PRAM) device. The PRAM device may include a semiconductor substrate in which a switching device is formed, a lower electrode configured to be formed on the switching device and having a void formed in a portion of an upper surface thereof, and a phase-change layer configured to be formed on the lower electrode having the void.

According to another aspect of an exemplary embodiment, there is provided a method of fabricating a phase-change random access memory (PRAM) device. The method may include providing a semiconductor substrate in which a lower electrode is formed, performing reduction treatment on an upper surface of the lower electrode to form a void in a portion of the upper surface of the lower electrode, and forming a phase-change layer on the lower electrode.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
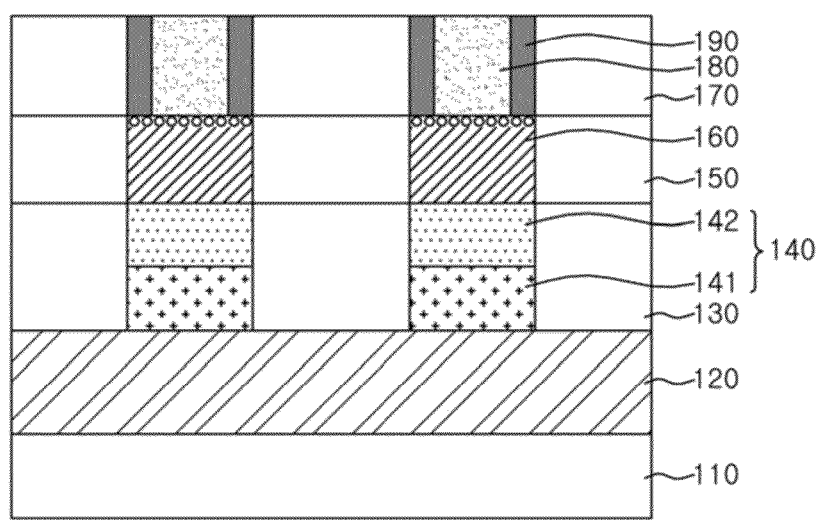
FIG. 1 is a view illustrating a structure of a PRAM device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it may be directly on the other or substrate, or intervening layers may also be present.

FIG. 1 is a view illustrating a structure of a PRAM according to an exemplary embodiment of the inventive concept.

Referring to FIG. 1, a PRAM according to an exemplary embodiment of the inventive concept may include an n$^+$ type base region 120 formed on a semiconductor substrate 110, a switching device 140 formed on the n$^+$ type base region and including an n type region 141 and a p type region 142, a lower electrode 160 formed on the switching device 140 and including a void; a phase-change layer 180 formed on the lower electrode 160; and a spacer 190 formed on an outer sidewall of the phase-change layer 180 and configured to reduce thermal interference between cells. The reference numerals 130, 150, and 170 denote interlayer insulating layers.

Referring to FIG. 1, the switching device 140 is a PN diode including the n type region 141 and the p type region 142, but the switching device 140 may not be limited thereto and may be a shottky diode. Alternatively, the switching device may be a MOS transistor other than the diode.

The void formed in the lower electrode 160 may be formed in a surface in which the lower electrode 160 is in contact with the phase-change layer 180, for example, the portion of the upper surface of the lower electrode 160. The void includes, for example, a number of nano (nm)-sized voids.

The void formed in the upper surface of the lower electrode 160 which is an interfacial surface with the phase-change layer 180 is formed through reduction treatment and detailed description thereof will be made with reference to FIGS. 2A to 2D.

FIGS. 2A to 2D are views illustrating a method of manufacturing a PRAM device according to an exemplary embodiment of the inventive concept.

Figure 2A:
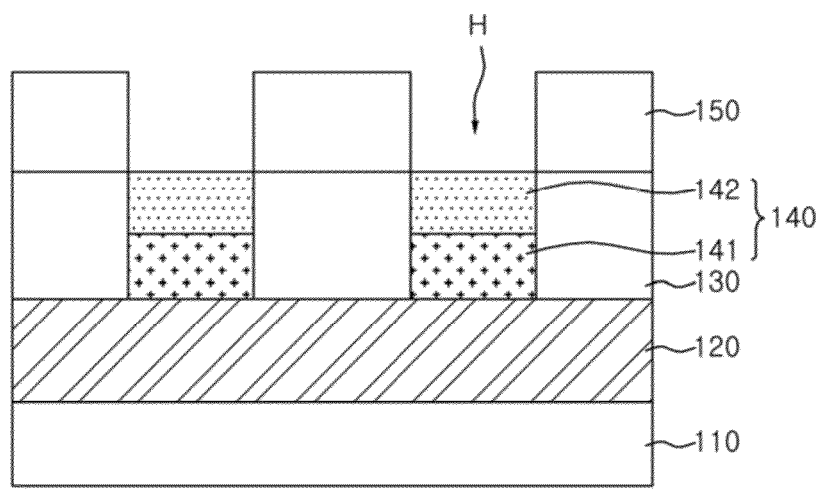
FIGS. 2A to 2D are views illustrating a method of manufacturing a PRAM device according to an exemplary embodiment of the inventive concept.

As illustrated in FIG. 2A, the method manufacturing a PRAM according to an exemplary embodiment includes providing a semiconductor substrate 110 and forming an n$^+$ type base region 120 by implanting n type impurities into an upper portion of the semiconductor substrate 110. A first interlayer insulating layer 130 including a hole is formed on the n$^+$ type base region 120 and a switching device 140 including an n type region 141 and a p type region 142 is formed in the hole. Subsequently, a second interlayer insulating layer 150 is deposited and a hole H exposing an upper surface of the switching device 140 is formed by performing a process such as a photolithography process.

Figure 2B:
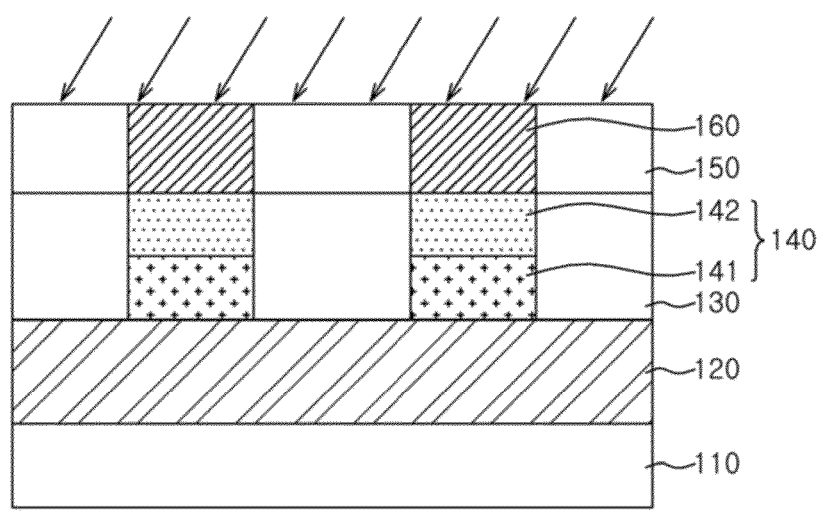

As illustrated in FIG. 2B, a lower electrode material is buried in the hole H and a planarization is performed to form a lower electrode 160. At this time, the lower electrode material may include titanium nitride (TiN) or titanium aluminum nitride (TiAlN). This is because TiN or TiAlN contains a carbon material and when a reducing agent for formation of a void V is permeated, the carbon material contained in TiN or TiAlN reacts with the reducing agent to generate gas. The lower electrode 160 may be formed using one or more method selected among a chemical vapor deposition (CVD) method, an atomic layer deposition (ALD) method, and a physical vapor deposition (PVD).

Figure 2C:
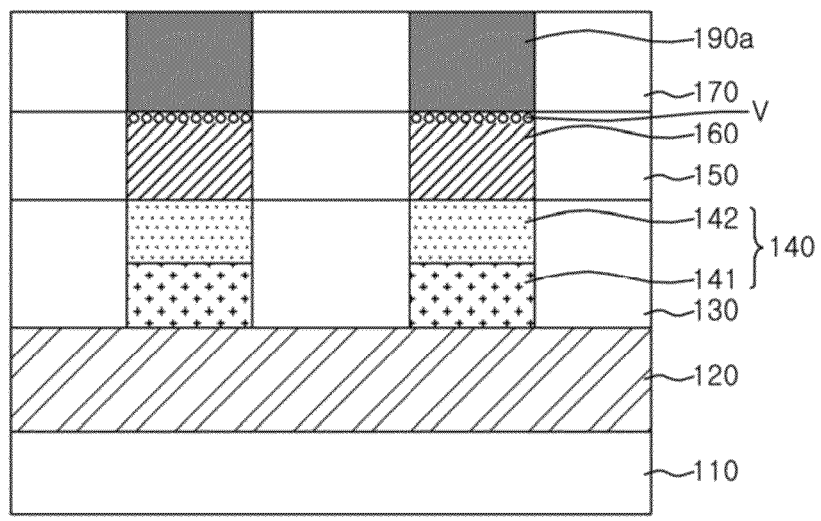

When the reducing agent containing nitrogen ions (N$^-$) or hydrogen ions (H$^-$) is permeated into a surface of the lower electrode 160 and plasma is generated, TiN or TiAlN which is the lower electrode material reacts with nitrogen ions or hydrogen ions and thus $CH_x$ gas, for example, $CH_2$, $CH_3$, or $CH_4$ gas is generated. Therefore, as illustrated in FIG. 2C, a void v having a nano size is generated in the upper surface of the lower electrode 160. In the above description, the void V, which is formed in the upper interfacial surface of the lower electrode 160, may be formed by permeating a reducing agent into the lower electrode 160 and performing plasma treatment. However, the void V may be formed by depositing a nitride material on the lower electrode 160, permeating a reducing agent into the nitride material, and performing plasma treatment.

As illustrated in FIG. 2C, an interlayer insulating layer 170 including a hole exposing the upper surface of the lower electrode 160 is deposited on the lower electrode 160 in which the void V is formed and a spacer material 190a is formed to be buried in the hole. The spacer material 190a may include nitride.

Figure 2D:
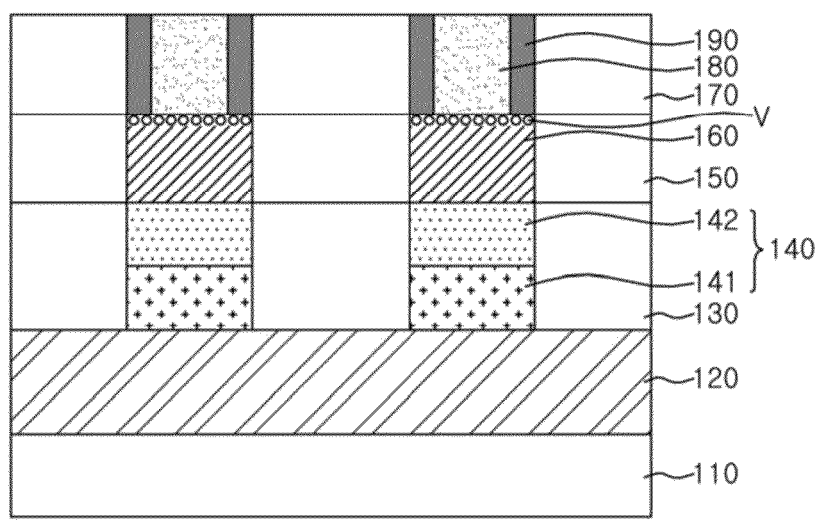

As illustrated in FIG. 2D, the spacer material 190a is patterned so that the spacer material 190a remains on only an inner sidewall of the hole formed in the third interlayer insulating layer 170. A phase-change material is deposited to be completely buried in the hole and then patterned to form a phase-change layer 180.

Subsequently, although it is not shown, an upper electrode may be formed on the phase-change layer 180.

The above-described PRAM device according to an exemplary embodiment forms the void V in a portion of the upper surface of the lower electrode, that is, a portion of an interfacial surface which is in contact with the phase-change layer 180, to reduce a contact area between the lower electrode 160 and the phase-change layer 180 and thus to reduce a reset current. The void V may be formed through another method.

FIGS. 3A to 3E are views illustrating a method of manufacturing a PRAM according to another exemplary embodiment of the inventive concept.

Figure 3A:
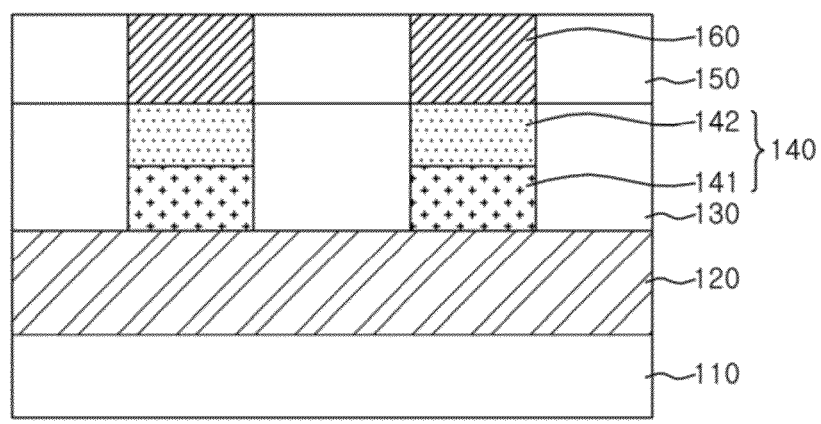
FIGS. 3A to 3E are views illustrating a method of manufacturing a PRAM device according to another exemplary embodiment of the inventive concept.

As illustrated in FIG. 3A, a semiconductor substrate 110 is provided, and as described with reference to FIGS. 2A and 2B, a lower electrode 160 is formed. A material for the lower electrode 160 may include any one of TiN and TiAlN. This is because TiN or TiAlN contains a carbon material and when a reducing agent for formation of a void V is permeated, the carbon material contained in TiN or TiAlN reacts with the reducing agent to generate gas. The lower electrode 160 may be formed using one or more method selected from among a chemical vapor deposition (CVD) method, an atomic layer deposition (ALD) method, and a physical vapor deposition (PVD).

Figure 3B:
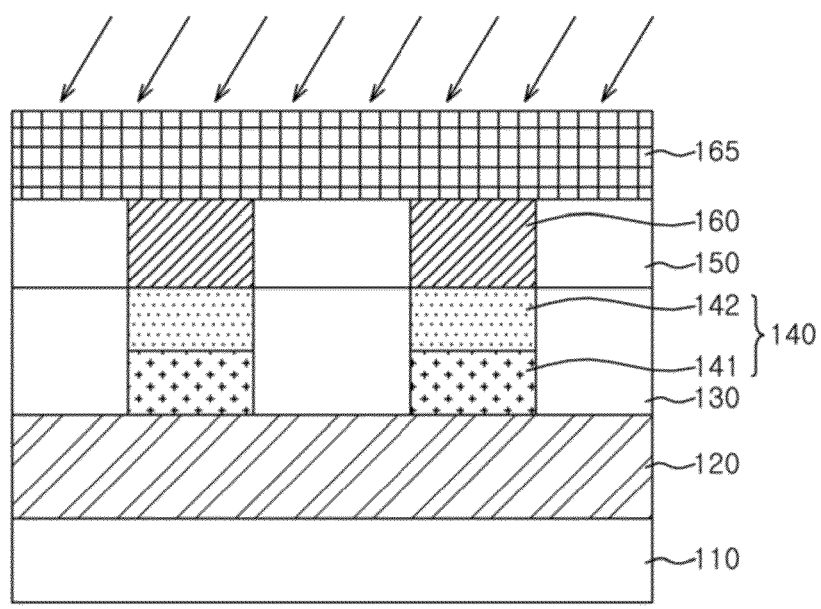

As illustrated in FIG. 3B, an oxide layer 165 is deposited on a second interlayer insulating layer 150 including the lower electrode 160. At this time, the oxide layer 165 may include one or more selected from among $Ti_4O_7$, $Ta_2O_5$, and $TiO_2$. A deposition height of the oxide layer 165 may be 20 Å to 50 Å.

Figure 3C:
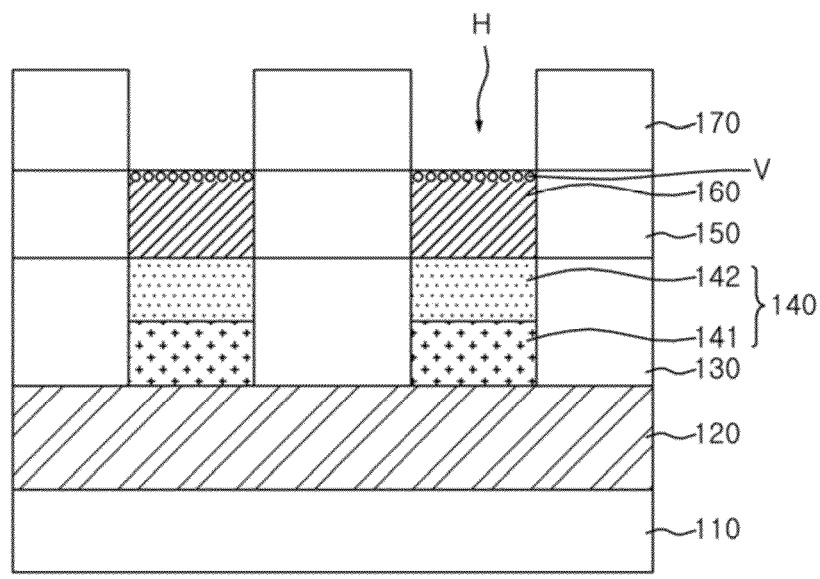

When the reducing agent containing nitrogen ions or hydrogen ions is permeated into a surface of the deposited oxide layer 165 and plasma is generated, ionized oxygen ion, carbon ion, and hydrogen ion are reacted to generate $CHO_x$, and a void V having a nano size is generated in the upper surface of the lower electrode 165 as illustrated in FIG. 3C. As described in the above exemplary embodiment, the void V formed in the upper surface of the lower electrode 160 is formed by forming the oxide layer 165, permeating a reducing agent into the oxide layer, and performing plasma treatment. However, the void V may be formed by depositing a nitride material on the lower electrode 160, permeating a reducing agent into the nitride material, and performing plasma treatment.

As illustrated in FIG. 3C, the oxide layer 165 is removed through an etching process and an interlayer insulating layer 170 is deposited on the lower electrode 160 in which the void V is formed. Subsequently, a hole H exposing the upper surface of the lower electrode 160 is formed in the third interlayer insulating layer 170.

Figure 3D:
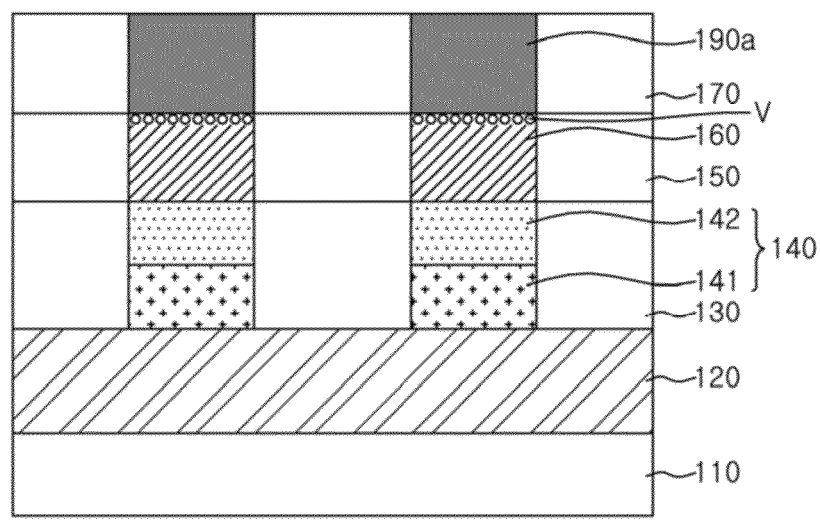

As illustrated in FIG. 3D, a spacer material 190a is formed to be buried in the hole formed in the third interlayer insulating layer 170. At this time, the spacer material may include nitride.

Figure 3E:
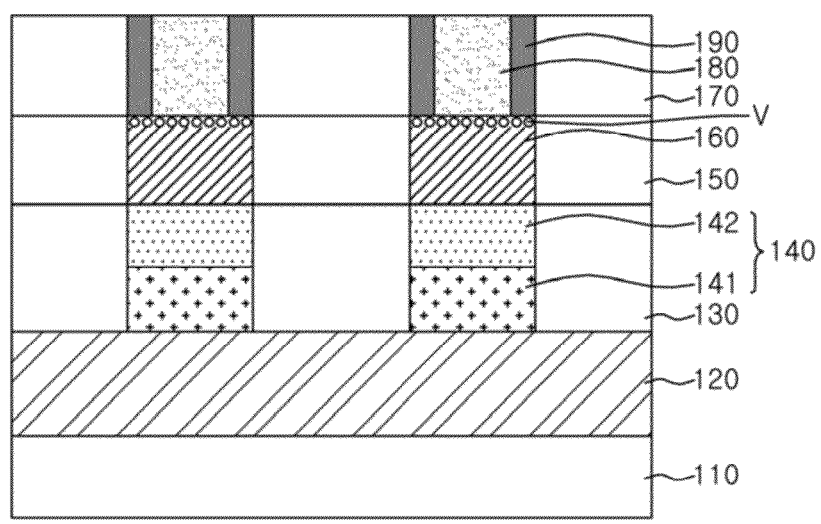

As illustrated in FIG. 3E, the spacer material 190a is patterned so that the spacer material 190a remains on only an inner sidewall of the hole formed in the third interlayer insulating layer 170. A phase-change material is deposited to be completely buried in the hole and then patterned to form a phase-change layer 180.

Subsequently although it is not shown, an upper electrode may be formed on the phase-change layer 180.

Figure 4:
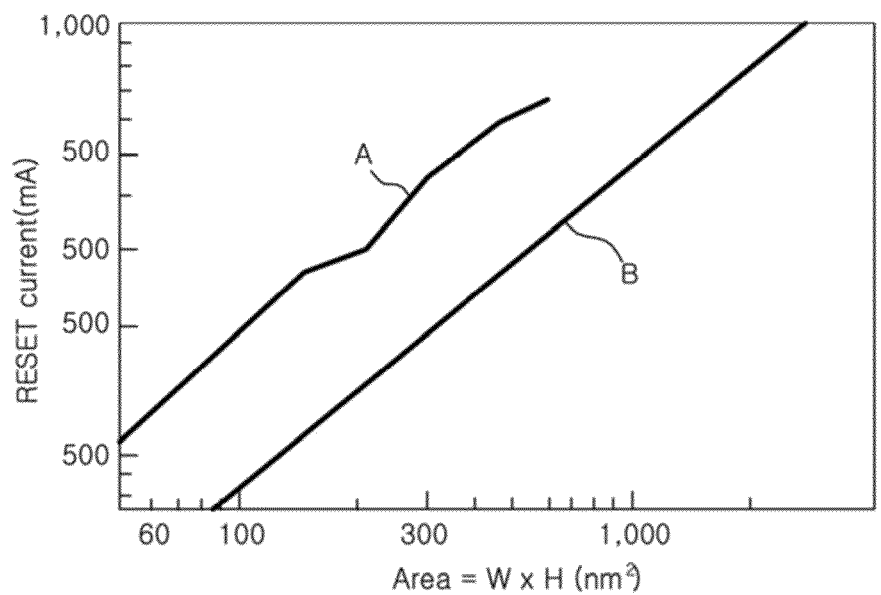
FIG. 4 is a view illustrating change in a reset current of a PRAM according to an exemplary embodiment of the inventive concept.

FIG. 4 is a view illustrating change in a reset current of a PRAM according to an exemplary embodiment of the inventive concept.

Referring to FIG. 4, "A" is a graph indicating change in a reset current when the void V is not formed in the upper surface of the lower electrode 160 and "B" is a graph indicating change in a reset current in which the void V is formed in the upper surface of the lower electrode 160 according to an exemplary embodiment of the inventive concept.

It may be seen from "B" that the void V is formed in the upper surface of the lower electrode 160 in the PRAM in accordance with the exemplary embodiment of the inventive concept, the contact area between the lower electrode 160 and the phase-change layer 180 may be reduced and thus the reset current is more reduced as compared with "A".

The above-described PRAM devices according to exemplary embodiments of the inventive concept may improve the lower electrodes to reduce a contact area with the phase-change layer 180 and thus to reduce a reset current.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A phase-change random access memory (PRAM) device, comprising:
    a semiconductor substrate in which a switching device is formed;
    a lower electrode formed on the switching device and having a plurality of voids formed in an upper surface of the lower electrode; and
    a phase-change layer formed on the lower electrode having the voids,
    wherein a contact area between the lower electrode and the phase-change layer is reduced by the plurality of voids.

2. The PRAM device of claim 1, wherein the lower electrode includes any one of titanium nitride (TiN) and titanium aluminum nitride (TiAlN).

3. The PRAM device of claim 2, wherein the lower electrode is formed using at least one method selected among a chemical vapor deposition (CVD) method, an atomic layer deposition (ALD) method, and a physical vapor deposition (PVD).

4. The PRAM device of claim 3, wherein the void is formed by a plasma-treated process using a reducing agent containing hydrogen ions or nitrogen ions.

5. The PRAM device of claim 4, further comprising:
    a spacer formed at an outer sidewall of the phase-change layer.

6. A method of fabricating a phase-change random access memory (PRAM) device, the method comprising:
    forming a lower electrode on a semiconductor substrate using a reactive gas having a carbon;
    performing reduction treatment on an upper surface of the lower electrode to form a plurality of voids in the upper surface of the lower electrode; and
    forming a phase-change layer on the lower electrode,
    wherein a contact area between the lower electrode and the phase-change layer is reduced by the plurality of voids.

7. The method of claim 6, wherein the forming voids includes:
    permeating a reducing agent into the upper surface of the lower electrode for reacting with the carbon of the lower electrode; and
    performing plasma treatment on the upper surface of the lower electrode into which the reducing agent is permeated.

8. The method of claim 6, wherein the forming the voids includes:
    forming a metal oxide layer on the lower electrode using a reactive gas having a carbon;
    permeating a reducing agent into a top of the metal oxide layer; and
    performing plasma treatment on the upper surface of the lower electrode having the metal oxide layer into which the reducing agent is permeated.

9. The method of claim 7, wherein the reducing agent includes any one of hydrogen ions and nitrogen ions.

10. The method of claim 8, wherein the reducing agent includes any one of hydrogen ions and nitrogen ions.

11. A phase-change random access memory (PRAM) device, comprising:
    a semiconductor substrate;
    a switching device formed on the semiconductor substrate;
    a lower electrode formed on the switching device and having an upper surface of the lower electrode having a plurality of voids; and
    a phase-change layer configured to be formed on the lower electrode having the voids,
    wherein the plurality of voids are generated by reducing of reactive ions for forming the low electrode, and
    wherein a contact area between the lower electrode and the phase-change layer is reduced by the plurality of voids.

12. The phase-change random access memory (PRAM) device of claim 11, wherein the voids comprise a number of nano (nm)-sized voids.

13. A method of fabricating a phase-change random access memory (PRAM) device, the method comprising:
    providing a semiconductor substrate;
    forming a lower electrode on the semiconductor substrate;
    performing reduction treatment on an upper surface of the lower electrode to form a plurality of voids in the upper surface of the lower electrode; and
    forming a phase-change layer on the lower electrode,
    wherein the plurality of voids are generated by reducing of reactive ions for forming the low electrode, and
    wherein a contact area between the lower electrode and the phase-change layer is reduced by the plurality of voids.

14. The method of claim 13, wherein the voids comprise a number of nano (nm)-sized voids.

* * * * *